United States Patent [19]

Allen et al.

[11] Patent Number: 5,372,912
[45] Date of Patent: Dec. 13, 1994

[54] RADIATION-SENSITIVE RESIST COMPOSITION AND PROCESS FOR ITS USE

[75] Inventors: Robert D. Allen, San Jose, Calif.; Jr. Conley, Cornwall, N.Y.; William D. Hinsberg, III, Fremont, Calif.; Pamela E. Jones, Bronx; Kevin M. Welsh, Fishkill, both of N.Y.

[73] Assignee: International Business Machines Corporation, Armonk, N.Y.

[21] Appl. No.: 998,984

[22] Filed: Dec. 31, 1992

[51] Int. Cl.⁵ .............................. G03C 1/76
[52] U.S. Cl. ............................ 430/270; 430/910
[58] Field of Search ............ 430/270, 910; 522/30, 522/69

[56] References Cited

U.S. PATENT DOCUMENTS

| | | | |
|---|---|---|---|
| 4,289,845 | 9/1981 | Bowden et al. | 430/296 |
| 4,618,564 | 10/1986 | Demmer et al. | 430/270 |
| 4,672,020 | 6/1987 | Koelsch et al. | 430/166 |
| 5,045,431 | 9/1991 | Allen et al. | 430/270 |
| 5,071,730 | 12/1991 | Allen et al. | 430/270 |
| 5,085,972 | 2/1992 | Vogel | 430/270 |

FOREIGN PATENT DOCUMENTS 244762A  11/1987  European Pat. Off. .

OTHER PUBLICATIONS

Reichmanis et al., "Chemical Amplification Mechanisms for Microlithography", Chem. Mater. 1991, 3 394–407.

Ito et al., "Novel Polymeric Dissolution Inhibitor for the Design of Sensitive, Dry Itch Resistant, Base-Developable Resist", J. Electrochem. Soc. Solid-State Science and Technology, Sep. 1988.

O'Brien et al., "Mid-UV Photoresists Combining Chemical Amplification and Dissolution Inhibition", SPIE vol. 920 Advances in Resist Technology and Processing V (1988).

Giptstein et al., "Evaluation of Pure Novolak Cresol—Formaldehyde Resins for Deep U.V. Lithography", J. Electrochem. Soc.: Solid-State Science and Technology, Jan. 1982, vol. 129, No. 1.

Brunner, "Optimization of Optical Properties of Resist Processes", SPIE vol. 1466, Advances in Resist Technology and Processing VIII (1991).

Schlegel et al., "Highly Sensitive Positive Deep-UV Resist Utilizing and Sulfonate Acid Generator and a Tetrahydropyranyl Inhibitor", Microelectronic Engineering 14 (1991) 227–236.

Primary Examiner—Thorl Chea
Attorney, Agent, or Firm—Robert B. Martin

[57] ABSTRACT

The present invention relates to a radiation-sensitive resist composition and the process for its use in the manufacture of integrated circuits. The composition comprises a radiation-sensitive acid generator, a binder soluble in aqueous base and an acrylate copolymer having acid labile pendant groups.

5 Claims, No Drawings

RADIATION-SENSITIVE RESIST COMPOSITION AND PROCESS FOR ITS USE

FIELD OF THE INVENTION

The present invention relates to a radiation-sensitive resist composition and the process for its use in the manufacture or integrated circuits.

BACKGROUND OF THE INVENTION

Lithographic techniques are widely used in industry to produce integrated circuit patterns in microelectronic devices such as integrated circuit chips, circuit boards and the like.

Commercially available lithographic positive, radiation-sensitive resist compositions generally contain a film-forming organic material and an o-naphthoquinone diazide which decomposes on exposure to radiation to form an indenecarboxylic acid. The film-forming organic material is usually an alkali-soluble phenol-formaldehyde novolac resin. Its dissolution in an aqueous alkaline solution is inhibited by the naphthoquinone diazide. However, when this diazide is decomposed in the irradiated areas, its efficacy as dissolution rate inhibitor decreases and the exposed areas or the coating become more soluble in a basic developer than the unexposed areas. However, the quinonediazides are not entirely satisfactory, due to their thermal instability. They decompose at moderately elevated temperatures to become unsuitable as dissolution inhibitors. Further, during normal use, the differential solubility between the exposed and the unexposed areas of the film is not high enough for certain applications. Reichmanis et al., "Chemical Amplification Mechanisms for Microlithography Chem. Mater. 3, 394 (1991), discloses the use of the tert-butyl ester of cholic acid as a dissolution inhibitor for phenol-formaldehyde matrix resin. The ester is formulated with a photoacid generator in the resin. Upon exposure to radiation, cholic acid is formed in the exposed areas making these areas more soluble in aqueous base. However, again, the differential solubility between the exposed and unexposed areas of the film is not high enough for certain applications.

It is therefore an object of the present invention to provide a radiation sensitive resist composition which has improved post-exposure differential solubility.

Other objects and advantages will become apparent from the following disclosure.

SUMMARY OF THE INVENTION

The present invention relates to a positive tone, radiation-sensitive resist composition comprising a radiation-sensitive acid generator, a binder soluble in aqueous base and an acid labile copolymer comprising the reaction product of (i) acrylic acid, methacrylic acid or mixtures thereof (ii) alkyl methacrylate, alkyl acrylate or mixtures thereof and (iii) a monomer having an acid labile pendant group. The radiation-sensitive resist composition of the present invention provides improved post-exposure differential solubility. The present invention also relates to the use of the resist composition to make integrated circuits and to an integrated circuit assembly made using the composition.

A more thorough disclosure of the present invention is presented in the detailed description which follows.

DETAILED DESCRIPTION OF THE INVENTION

The present invention relates to a positive tone, radiation-sensitive composition comprising a radiation-sensitive acid generator, a polymeric binder soluble in aqueous base and a copolymer comprising the reaction product of (i) acrylic acid, mothacrylic acid or mixtures thereof; (ii) alkyl methacrylate, alkyl acrylate or mixtures thereof and (iii) a monomer having an acid labile pendant group.

The key ingredient in the resist composition is the copolymer. The copolymer is the reaction product of a plurality of monomers. The first monomer is selected from acrylic acid or mothacrylic acid or mixtures thereof. The preferred monomer is methacrylic acid. The acid monomer contributes to the dissolution enhancing property of the copolymer. The second monomer is selected from alkyl acrylate, alkyl methacrylate or mixtures thereof. Various types of alkyl ester of these monomers can be used to synthesize the copolymer. Preferred alkyl esters are methyl, and ethyl. The second monomer contributes to the solubility of the copolymer in the polymeric binder. The third monomer has an acid labile pendant group. The third monomer provides acid sensitive groups pendant on the copolymer backbone.

The preferred acid labile pendant groups are organic ester groups which undergo a cleavage reaction in the presence of an acid. Preferred ester groups are t-butyl esters of carboxcylic acids and t-butyl carbonates of phenols. However, it is understood that a wide range of acid labile groups are operative in the invention. For instance, additional acid sensitive groups are listed in U.S. Pat. No. 4,491,628, "Positive- And Negative-Working Resist Compositions With Acid Generating Photoinitiator and Polymer With Acid-Labile Groups Pendant From Polymer Backbone", H. Ito, C. G. Willson, and J. M. J. Frechet, the disclosure of which is incorporated herein by reference. Preferred monomers useful in the practice of the present invention include the t-butyl esters of acrylates and methacrylates. The third monomer in combination with the radiation sensitive acid generator contributes radiation sensitivity to the copolymer. The copolymer can also optionally comprise other monomers known to those skilled in the art.

The copolymer of the present invention will generally comprise about 1 to 20 weight % (preferably about 10 to 15 weight %) of the acrylic acid, methacrylic acid or mixtures thereof component; about 35 to 65 weight % (preferably about 50 to 60 weight %) of the methacrylate, acrylate or mixtures thereof component and about 15 to 50 weight % (preferably about 20 to 40 weight %) of the monomer with acid labile group component. The choice of the specific monomers and their weight percent in copolymer is varied depending upon the properties desired in the copolymer. For example, by varying the amount of the methacrylic acid component in the copolymer, the dissolution enhancement/inhibition property of the copolymer can be optimized in a specific binder without varying the amount of the copolymer in the composition. The radiation sensitivity of the copolymer can be varied by varying the amount of the methacrylic acid component and the monomer component with the acid labile group. Lastly, the glass transition temperature can be varied to some extent by varying the amount of the acrylate component and the methacrylic acid component in the copolymer within the range of solubility of the copolymer in the binder. The copolymer is uniquely soluble in phenolic binders to enable the formation of a homogenous composition without phase separation. The copolymer is also substantially transparent in the deep UV spectrum thereby enabling the use of novolacs as a binder for deep UV lithography. The copolymer will generally comprise about 10 to about 50 weight % of composition.

The copolymer can be synthesized by standard free radical solution polymerization techniques known by those skilled in the art. Suitable copolymers are disclosed in Allen et al., U.S. Pat. Nos. 5,045,431 and 5,071,730, the disclosures of which arc incorporated herein by reference.

The second component of the resist composition of the present invention is a polymeric binder which is soluble in aqueous base. Suitable binders include phenolic binders such as phenolic polymers (e.g. hydroxystyrene and carbon and oxygen alkylated derivatives), and novolacs. Suitable novolacs are resins from an aldehyde such as acetaldehyde or formaldehyde, with a phenol such as phenol itself, or phenol substituted with 1 or 2 alkyl groups of 1 to 9 carbon atoms each, e.g., o-, m-, and p-cresol, the xylenols, p-tert.butyl phenol, and p-nonyphenol, p-phenyl-phenol, resorcinol and bis(4-hydroxyphenyl)methane. Preferred binders are alkylated hydroxystyrene polymers and cresol novolacs.

Other suitable aqueous base soluble resins will be known to those skilled in the art. The resin will preferably comprises about 50 to 90 weight % of the composition.

The positive tone resist composition also comprises a photosensitive acid generator. Upon exposure to radiation, the radiation-sensitive acid generator generates a strong acid. Suitable acid generators include triflates, (e.g. triphenylsulfonium triflate), pyrogallol (e.g. trimesylate of pyrogallol), onium salts such as triarylsulfonium and diaryl iodonium hexafluorantimonates, hexafluoroarsenates, trifluoromethane sulfonates and others; trifluoromethanesulfonates esters of hydroxyimides, alpha-alpha'-bis-sulfonyl diazomethanes, sulfonate esters of nitro-substituted benzyl alcohols and napthoquinone-4-diazides.

Other suitable photoacid generators are disclosed in Allen's patent above and Reichmanis et al., review article (Chem. Mails. 3, p. 395, 1991) the disclosures of which are incorporated herein by reference. Preferably, the radiation-sensitive acid generator comprises about 1 to about 20 weight % of the composition.

The present invention also relates to a process for generating a positive tone resist image on a substrate comprising the steps of: (a) coating a substrate with a film comprising the positive tone resist composition of the present invention; (b) imagewise exposing the film to radiation; and (c) developing the image.

The first step involves coating the substrate with a film comprising the positive tone resist composition dissolved in a suitable solvent. Suitable substrates are comprised of silicon, ceramics, polymer or the like. Suitable solvents include propylene glycol methyl ether acetate (PGME) or cyclohexanone. The film can be coated on the substrate using art known techniques such as spin or spray coating, or doctor blading. Preferably, before the film has been exposed to radiation, the film is heated to an elevated temperature of about 90° to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wavelength of about 240 to 514 nm preferably about 250 nm (248/254 nm). Suitable radiation sources include mercury, mercury/xenon, and xenon lamps, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. Surprisingly, the solubility of the exposed resist composition in aqueous base is greater than the solubility of the virgin binder in aqueous base. Preferably, after the film has been exposed to radiation, the film is again heated to an elevated temperature of about 90° to 150° C. for a short period of time of about 1 min.

The third step involves development of the positive tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer. Further, because the copolymer has a very low optical density in the deep UV (e.g. 250 nm), it enables the use of novalacs as a binder for deep UV lithography. Lastly, the copolymer raises the Tg of novolac containing compositions thereby improving their performance in post-image development processes.

The present invention also relates to an integrated circuit assembly such as an integrated circuit chip, multichip module or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition or laser induced deposition. The surface of the film can be milled to remove any excess conductive material. Dielectric materials may also be deposited by similar means during the process of making circuits. Inorganic ions such as boron, phosphorous or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLE I

A resist composition comprising (i) about 69 weight % of poly (3-methyl-4-hydroxystyrene); (ii) about 29 weight % of a copolymer [comprising 47% methylmethacrylate (MAA) 38% t-butylmethacrylate (TBMA) and 15% methacrylic acid (MAA)] and (iii) about 2 weight % of triphenylsulfonium triflate was dissolved in PGME and spin coated on a silicon substrate. The film was baked at 90° C. for 90 sec and then exposed at 248 nm (about 6 mJ/cm$^2$). The film was again baked at 90° C. for 90 see and developed in ammonium hydroxide to give an image (0.6 micron lines and spaces 1 micron thick) with vertical wall profiles without T-topping.

EXAMPLE II—COMPARATIVE RESIST PERFORMANCE

Three resist compositions were prepared

Composition 1. 10 weight % of the triester of 1-oxo-2diazonaphthoquinone-4-sulfonic acid with 2,3,4-trihydroxybenzophenone (tris-F), 2.5 weight % of a copolymer (60% MAA; 25% TBMA; 15% MAA) and 87.5 weight % of novolac.

Composition 2. 10 weight % of tris-F; 2.5 weight % of (1,1,1 butoxycarbonylmethoxyphenyl) ethane and 87.5 weight % of novolac.

Composition 3. 10 weight % of tris-F; 3.8 weight % of (1,1,1 butoxycarbonylmethoxyphenyl) ethane and 86.2 weight % of novolac.

Each of the compositions was dissolved in propylene glycol methyl ether acetate and spin coated as a one micron film on a silicon substrate. The films were then baked at 95° C. for 60 sec. A portion of each film was then exposed at 405 nm with a close sufficient to decompose substantially all of the tris-F photoacid generator (each exposed film was given the same dose). The film was then developed with 0.263N aqueous tetramethyl ammonium hydroxide using laser end point detector to measure dissolution rates and give the following contrast values.

| Composition | R (Å/min) | $R_o$ (Å/min) | $R/R_o$ |
|---|---|---|---|
| 1 | 529,235 | 44 | 12,028 |
| 2 | 77,949 | 672 | 116 |
| 3 | 84,107 | 410 | 205 |

(R - exposed; $R_o$ unexposed)

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A radiation sensitive resist composition comprising a radiation-sensitive acid generator, a polymeric binder soluble in aqueous base and a copolymer comprising the reaction product of:
   (i) acrylic acid, or methacrylic acid or mixtures thereof;
   (ii) alkyl methacrylate, alkyl acrylate or mixtures thereof; and
   (iii) a monomer having an acid labile pendant group.

2. The composition of claim 1 wherein said acid labile pendant group is an organic ester.

3. The composition of claim 2 wherein said organic ester is t-butyl ester of carboxylic acid or t-butyl carbonate of phenol.

4. The composition of claim 1 wherein said binder is a phenolic binder.

5. The composition of claim 4 wherein said binder is novolac.

* * * * *